United States Patent [19]

Nakamura et al.

[11] 4,238,560
[45] Dec. 9, 1980

[54] PHOTOSENSITIVE PRINTING PLATE FORMING MATERIAL HAVING A NOVEL MATTING LAYER COMPOSITION

[75] Inventors: Yasuo Nakamura; Yoshio Okishi, both of Shizuoka, Japan

[73] Assignee: Fuji Photo Film Co., Ltd., Minami-ashigara, Japan

[21] Appl. No.: 71,414

[22] Filed: Aug. 30, 1979

[30] Foreign Application Priority Data

Aug. 30, 1978 [JP] Japan .................. 53-105883

[51] Int. Cl.³ ..................... G03C 1/76; G03F 7/02
[52] U.S. Cl. ................... 430/162; 430/166; 430/273; 430/300; 430/496; 430/523; 430/531; 430/533; 430/950; 430/961; 101/454; 101/455; 101/456; 101/457; 101/462
[58] Field of Search ............... 430/162, 166, 167, 273, 430/300, 496, 523, 531, 533, 950, 961; 101/454, 455, 456, 457, 462

[56] References Cited

U.S. PATENT DOCUMENTS

| | | | |
|---|---|---|---|
| 3,022,169 | 2/1962 | Heckelmann | 430/533 |
| 3,525,616 | 8/1970 | Hackmann et al. | 430/270 |
| 3,625,692 | 12/1971 | Meyer et al. | 430/961 X |
| 4,021,242 | 5/1977 | Newyear | 430/270 |
| 4,168,979 | 9/1979 | Okishi et al. | 430/950 X |

FOREIGN PATENT DOCUMENTS 1495361 12/1977 United Kingdom.

OTHER PUBLICATIONS

Hayes et al., Chemical Abstracts, vol. 73, 1970, p. 135931g.

*Primary Examiner*—Edward C. Kimlin
*Attorney, Agent, or Firm*—Sughrue, Rothwell, Mion, Zinn and Macpeak

[57] ABSTRACT

A photosensitive printing plate forming material having on its surface a matting layer composed of a resin and a fine particulate material dispersed therein, said resin being at least one member selected from rosin and rosin esters.

9 Claims, 6 Drawing Figures

PHOTOSENSITIVE PRINTING PLATE FORMING MATERIAL HAVING A NOVEL MATTING LAYER COMPOSITION

BACKGROUND OF THE INVENTION

1. Field of the Invention

This invention relates to a photosensitive printing plate forming material and more particularly a material which is exposed by the vacuum contact method.

2. Description of the Prior Art

In the exposure of photosensitive printing plates through an image-bearing original, complete contact of the image-bearing original with the surface of a photosensitive layer of the photosensitive printing plate or with the surface of a resin layer which may be formed on top of the photosensitive layer (to be inclusively referred to simply as the surface of a photosensitive printing plate) has previously been secured by disposing the photosensitive printing plate and the image-bearing original in superposed condition between a rubber sheet and a press-bonded glass and evacuating the space between the rubber sheet and the press-bonded glass (hereafter this method is referred to as the "vacuum-contacting method"). Here and throughout the balance of this disclosure the term "photosensitive printing plate" will be used with reference to the presensitized material from which the plate is formed as opposed to the plate itself. A conventional photosensitive printing plate has a smooth surface. When an image-bearing original is contacted intimately with the surface of the printing plate by the vacuum-contacting method, contact is first accomplished at the peripheral portion of the printing plate. Hence, evacuation of the central portion is impeded, and extremely long periods of time are required to bring the image-bearing original into complete contact with the entire surface of the photosensitive printing plate. When the printing plate is exposed imagewise while contacting of the image-bearing original is incomplete, a clear image is not obtained in the portions where contact is incomplete and clear printed copies cannot be obtained. Since the extended period of time required for contacting reduces the efficiency of the plate-making operation, it has long been desired to shorten this time.

British Pat. No. 1,495,361 discloses a photosensitive printing plate obtained by shortening such contact time. By providing a matting layer removable at the time of development as the uppermost layer of the photosensitive printing plate, the time required for vacuum-contact can be markedly shortened. It gives as one example of the matting layer a layer composed of a fine particulate material as a matting agent dispersed in a resin as a binder. Specific examples of the resin include water-soluble resins such as gum arabic, cellulose and polyvinyl alcohol, and hydrophobic resins such as epoxy resins and phenolic resins.

It has been found, however, that in the photosensitive printing plate containing the water-soluble resin as a binder of the matting layer, the matting layer absorbs moisture in the air which in turn causes deterioration of the photosensitive layer. It has also been found that the photosensitive printing plate containing the aforesaid hydrophobic resin as a binder for the matting layer requires a longer developing time than does a photosensitive printing plate having no matting layer.

SUMMARY OF THE INVENTION

Accordingly, a principal object of the present invention is to provide a photosensitive printing plate useful in a vacuum-contacting method having a matting layer which does not absorb moisture.

It is another object of the present invention to provide a photosensitive printing plate comprising a support, a photosensitive layer and a matting layer having a relatively short developing time.

As a result of extensive investigations to overcome the aforesaid defects, it has been found that a photosensitive printing plate free from these defects can be obtained using at least one resin selected from rosin and rosin esters as a binder for the matting layer.

According to this invention, there is provided a photosensitive printing plate having on its surface a matting layer composed of a resin and a fine particulate material dispersed therein, said resin being at least one member selected from the group consisting of rosin and rosin esters.

DETAILED DESCRIPTION OF THE INVENTION

Figure 1A:
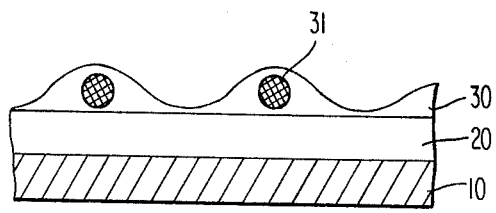
FIGS. 1a to 3b are schematic sectional views showing photosensitive printing plates of this invention and printing plates made therefrom.

The photosensitive printing plates having a matting layer formed on its surface is basically composed of a support and a photosensitive layer. It includes materials for making lithographic printing plates, relief printing plates and intaglio printing plates, preferably the lithographic printing plates and intaglio printing plates.

The support used in the present invention includes dimensionally stable plate-like materials such as those which have been used as a support for printing plates. These platelike materials can be conveniently used in this invention. Specific examples of the support include paper, paper sheets to which plastics (e.g., polyethylene, polypropylene, polystyrene) are laminated, sheets of metals such as aluminum (including aluminum alloys), zinc, iron and copper, films of plastics such as cellulose diacetate, cellulose, triacetate, cellulose propionate, cellulose butyrate, cellulose butyrate acetate, cellulose nitrate, polyethylene terephthalate, polyethylene, polystyrene, polypropylene, polycarbonate and polyvinyl acetal, and paper or plastic films on which the aforesaid metals are laminated or vacuum-deposited.

A suitable type of the support is selected depending upon the type of printing plate. For example, in the case of photosensitive lithographic printing plates, an aluminum plate, and the composite sheet disclosed in Japanese Patent Publication No. 18327/73 composed of a polyethylene terephthalate film and an aluminum sheet bonded thereto are preferred. In the case of photosensitive relief printing plates, a polyethylene terephthalate film, an aluminum plate, and an iron plate are preferred.

As required, the support is surface-treated. For example, in the case of a photosensitive lithographic printing plate, the surface of the support is subjected to a treatment for rendering it hydrophilic. This treatment can be performed in various modes. For example, a support having a plastic surface may be treated by a "surface-treating" method such as chemical treatment, discharge treatment, flame treatment, ultraviolet light treatment, high frequency treatment, glow discharge treatment, active plasma treatment and laser treatment (see, for example, U.S. Pat. Nos. 2,764,520, 3,497,407, 3,145,242, 3,376,208, 3,072,483, 3,475,193 and 3,360,448, and British Pat. No. 788,365), or by combination of the aforesaid surface treatment and subsequent coating of a subbing layer on the plastics.

Various coating methods can be used to form the subbing layer. Suitable methods include a multilayer method which comprises forming a hydrophobic resin layer which adheres well to the plastics and has good solubility as a first layer, and coating a hydrophilic resin layer as a second layer. A single-layer method which comprises coating a layer of a resin containing both a hydrophobic group and a hydrophilic group can also be used.

A metal support, especially a support having an aluminum surface is preferably subjected to a graining treatment, a treatment of dipping in an aqueous solution of sodium silicate, potassium fluorozirconate, a phosphate salt, etc., or a surface treatment such as anodizing. Also used conveniently are an aluminum plate subjected to graining and then to dipping in an aqueous solution of sodium silicate disclosed, for example, in U.S. Pat. No. 2,174,066 and an aluminum plate which has been anodized and then dipped in an aqueous solution of an alkali metal silicate disclosed, for example, in U.S. Pat. No. 3,181,461. The anodizing treatment can be carried out by passing an electric current through an electrolytic solution comprising one or more of aqueous or nonaqueous solutions of inorganic acids such as phosphoric acid, chromic acid, sulfuric acid and boric acid, organic acids such as oxalic acid or sulfamic acid, or salts of these using an aluminum plate as an anode.

The electrodeposition of silicate disclosed in U.S. Pat. No. 3,658,662 is also effective.

These hydrophilizing treatments are performed for the purpose of not only rendering the surface of the support hydrophilic, but also preventing detrimental reaction with the photosensitive composition to be formed thereon or increasing adhesion to the photosensitive layer.

The photosensitive composition may be a photosensitive composition whose solubility or swellability in or with a developing solution changes after exposure. For example:

(1) Compositions composed of diazo resins

Diazo resins which are typified by a condensate of p-diazodiphenylamine and paraformaldehyde may be water-soluble or insoluble, and they are preferably insoluble in water and soluble in conventional organic solvents. Particularly preferred diazo compounds are salts of a condensate of p-diazophenylamine and formaldehyde or acetaldehyde such as a compound having two or more diazo groups in its molecule in the form of a phenolate, fluorocaprate or salts of sulfonic acids such as triisopropylnaphthalenesulfonic acid, 4,4-diphenyldisulfonic acid, 5-nitro-ortho-toluenesulfonic acid, 5-sulfosalicylic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoylbenzenesulfonic acid and paratoluenesulfonic acid. Other preferred diazo resins include a condensate of 2,5-dimethoxy-4-p-tolyl-mercaptobenzene-diazonium and formaldehyde in the form of the salts illustrated above. Another preferred example is the diazo resin described in British Pat. No. 1,312,925.

While these diazo resins may individually serve as a photosensitive material to be used for preparing a resist, they are preferably used in combination with a binder. A variety of polymers can be used as the binder. A preferred binder contains a hydroxy, amino, carboxylic acid, amido, sulfonamido, active methylene, thiol, epoxy and other functional groups. Examples of such preferred binder are: shellac such as described in British Pat. No. 1,350,521; a polymer such as described in British Pat. No. 1,460,978 and U.S. Pat. No. 4,125,276 which contains a hydroxyethyl acrylate or hydroxyethyl methacrylate unit as the predominant repeating unit; a polyamide resin of the type described in U.S. Pat. No. 3,751,257; a phenolic resin and a polyvinyl acetal resin such as polyvinyl formal resin or polyvinyl butyral such as described in British Pat. No. 1,074,392; a linear polyurethane resin, polyvinyl alcohol resin esterified with phthalic acid, an epoxy resin prepared by condensing bisphenol A and epichlorohydrin, a polymer containing an amino (meth)acrylate, cellulose such as cellulose acetate, cellulose alkyl ether, cellulose acetate phthalate such as described in U.S. Pat. No. 3,660,097.

These binders are suitably contained in the photo-sensitive resist forming composition in an amount of from 40 to 95 wt%. Higher binder content (in other words, lower diazo resin content) of course results in greater sensitivity but this is compromised by low time-dependent stability. Optimum content of the binder is in the range of from about 70 to 90 wt%.

Compositions composed of these diazo resins may optionally contain other additives such as phosphoric acid, dye and pigment as described in U.S. Pat. No. 3,236,646.

(2) Compositions composed of o-quinonediazide compounds

A particularly preferred o-quinonediazide compound is an o-naphthoquinonediazide compound of the type described in U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709, 3,647,443, and many other publications. Particularly preferred are an o-naphthoquinonediazidosulfonic acid ester or o-naphthoquinonediazidocarboxylic acid ester of an aromatic hydroxy compound, and an o-naphthoquinonediazidosulfonamide or o-naphthoquinonediazidocarboxylic acid amide of an aromatic amino compound. Very effective compounds are a condensate of pyrogallol and acetone esterified with o-naphthoquinonediazidosulfonic acid as described in U.S. Pat. No. 3,635,709; a polyester having a terminal hydroxy group esterified with o-naphthoquinonediazidosulfonic acid or o-naphthoquinonediazidocarboxylic acid as described in U.S. Pat. No. 4,028,111; a homopolymer of p-hydroxystyrene or a copolymer thereof with another copolymerizable monomer which is esterified with o-naphthoquinonediazidosulfonic acid or o-naphthoquinonediazidocarboxylic acid as described in British Pat. No. 1,494,043.

While these o-quinonediazide compounds can be used independently, they are preferably used as a mixture with an alkali-soluble resin. A suitable alkali-soluble resin includes a novolak type phenolic resin such as a phenolformaldehyde resin, an o-cresol-formaldehyde resin or m-cresol-formaldehyde resin. More preferably, these phenolic resins are used in combination with a tert-butylphenol-formaldehyde resin which is a condensate of formaldehyde and phenol or cresol substituted by an alkyl group having 3 to 8 carbon atoms, as described in U.S. Pat. No. 4,123,279. These alkali-soluble resins are contained in the photosensitive resist forming composition in an amount of from about 50 to 85 wt%, preferably from 60 to 80 wt%, based on the total weight of said composition.

Photosensitive compositions composed of these o-quinonediazide compounds may optionally contain other additives such as pigment, dye and plasticizer.

(3) Compositions composed of photosensitive azide compounds

A suitable photosensitive azide compound is an aromatic azide compound wherein an azido group is bonded to the aromatic ring either directly or through a carbonyl group or sulfonyl group. Upon exposure to light, the azido group of the compound is decomposed to form nitrene which enters into various reactions that insolubilize the compound. A preferred aromatic azide compound is such that it contains one or more groups such as azidophenyl, azidostyryl, azidobenzal, azidobenzoyl and azidocinnamoyl; specific examples are 4,4'-diazidochalcone, 4-azido-4'-(azidobenzoylethoxy) chalcone, N,N-bis-p-azidobenzal-p-phenylenediamine, 1,2,6-tri(4'-azidobenzoxy)hexane, 2-azido-3-chlorobenzoquinone, 2,4-diazido-4'-ethoxy-azobenzene, 2,6-di(4'-azidobenzal)-4-methylcyclohexane, 4,4'-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4'-azidobenzal) cyclohexanone, 4,4'-diazidophenylmethane, 1-(4-azidophenyl)-5-furyl-2-penta-2,4-dien-1-one, 1-(4-azidophenyl)-5-(4-methoxyphenyl)penta-1,4-dien-3-one, 1-(4-azidophenyl)-3-(1-naphthyl)propen-1-one, 1-(4-azidophenyl)-3-(4-dimethylaminophenyl)propan-1-one, 1-(4-azidophenyl)-5-phenyl-1,4-pentadien-3-one, 1-(4-azidophenyl)-3-(4-nitrophenyl)-2-propen-1-one, 1-(4-azidophenyl)-3-(2-furyl)-2-propen-1-one, 1,2,6-tri(4'-azidobenzoxy)hexane, 2,6-bis(4-azidobenzylidyene-p-t-butyl)cyclohexanone, 4,4'-diazidodibenzalacetone, 4,4'-diazidostilbene-2,2'-disulfonic acid, 4,4'-diazidostilbene-α-carboxylic acid, di(4-azido-2'-hydroxybenzal)acetone-2-sulfonic acid, 4-azidobenzalacetophenone-2-sulfonic acid, 2-azido-1,4-dibenzenesulfonylaminonaphthalene, or 4,4-diazidostilbene-2,2'-disulfonic acid anilide.

These low molecular weight aromatic diazide compounds may advantageously be replaced by the azido-containing polymer which is illustrated in Japanese Patent Publication Nos. 9047/69, 31837/69, 9613/70, 24915/70, 25713/70, Japanese Patent Application (OPI) Nos. 5102/75, 84302/75, 84303/75, and 12984/78.

The above-defined photosensitive azide compounds are preferably used in combination with a polymer which works as a binder. A preferred binder is an alkali-soluble resin. Examples of the alkali-soluble resin include: a natural resin such as shellac or rosin; a novolak type phenolic resin such as phenol-formaldehyde resin or m-cresol-formaldehyde resin; a homopolymer of unsaturated carboxylic acid or a copolymer thereof with another copolymerizable monomer, such as polyacrylic acid, polymethacrylic acid, methacrylic acid-styrene copolymer, methacrylic acid-methyl acrylate copolymer or a styrene-maleic anhydride copolymer; a resin produced by reacting a partial or complete saponification product of polyvinyl acetate with an aldehyde such as acetaldehyde, benzaldehyde, hydroxybenzaldehyde or carboxybenzaldehyde to form partial acetal; and polyhydroxystyrene. Other suitable examples of the binder are organic solvent-soluble resins such as cellulose alkyl ethers typified by cellulose methyl ether and cellulose ethyl ether.

The binder is preferably contained in an amount of from about 10 to about 90 wt% based on the total weight of the composition composed of the photosensitive azide compound.

Compositions composed of the photosensitive azide compound may optionally contain a dye, pigment, a plasticizer such as phthalate ester, phosphate ester, aliphatic carboxylic acid ester, glycol or sulfonamide, and a sensitizer such as Michler's ketone, 9-fluorenone, 1-nitropyrene, 1,8-dinitropyrene, 2-chloro-1,2-benzanthraquinone, 2-bromo-1,2-benzanthraquinone, pyrene-1,6-quinone, 2-chloro-1,8-phthaloylnaphthalene, or cyanoacridine.

(4) Compositions composed of ethylenically unsaturated monomers

Ethylenically unsaturated compounds which have at least two unsaturated double bonds in the molecule and polymerize upon irradiation of actinic light include, for example, unsaturated esters of polyols (described, for example, in Japanese Patent Publication No. 8495/60 such as ethylene di(meth)acrylate, diethylene glycol di(meth)acrylate, glycerol di(meth)acrylate, glycerol tri(meth)acrylate, ethylene dimethacrylate, 1,3-propylene di(meth)acrylate, 1,4-cyclohexanediol (meth)acrylate, 1,4-benzenediol di(meth)acrylate, pentaerythritol tetra(meth)acrylate, 1,3-propylene glycol di(meth)acrylate, 1,5-pentadiol di(meth)acrylate, pentaerythritol tri(meth)acrylate, bisacrylates and methacrylates of polyethylene glycols having a number average molecular weight of 50 to 500), or unsaturated amides, especially amides of α-methylenecarboxylic acid, and α, ω-diamines and ω-diamines having oxygen interposed, such as methylenebis(meth)acrylamide and diethylenetriamine tris(meth)acrylamide, divinyl succinate, divinyl adipate, divinyl phthalate, or divinyl benzene-1,3-disulfonate. These compounds are used with a suitable binder such as a derivative of polyvinyl alcohol or cellulose which has a carboxyl group in the side chain, such as polyvinyl hydrogen phthalate, carboxymethyl cellulose and a copolymer of methyl methacrylate and methacrylic acid.

(5) Compositions composed of photosensitive resins having an unsaturated double bond in the molecule Photosensitive resin which have an unsaturated double bond in the molecule and become insoluble upon the irradiation of actinic light are typified by polyvinyl cinnamate, derivatives of polyvinyl cinnamate described, for example, in the specifications of British Pat. Nos. 843,545 and 966,297 and U.S. Pat. No. 2,725,372, unsaturated polyesters formed by condensation between bisphenol A and divanillal cyclohexanone or between p-phenylenediethoxyacrylate and 1,4-di-β-hydroxyethoxycyclohexanone as described in Canadian Pat. No. 696,997, prepolymers of diallyl phthalate as described in U.S. Pat. No. 3,462,267.

Photosensitive compositions comprising an o-diazooxide type photosensitive material disclosed, for example, in U.S. Pat. No. 3,635,709, a phosphotungstate salt of a diazo resin (Japanese Patent Publication No.

7663/65), potassium ferrocyanide of a diazo resin (U.S. Pat. No. 3,113,023), a combination of a diazo resin and polyvinyl hydrogen phthalate (Japanese Patent Publication No. 23684/68), etc., are useful as positive working materials.

Photosensitive compositions comprising linear polyamides and monomers containing an addition-polymerizable unsaturated bond which are described in U.S. Pat. No. 3,081,168, 3,486,903, 3,512,971, and 3,615,629 are also useful.

Basically, the photosensitive printing plate having a matting layer formed thereon which is used in this invention consists of a support and a photosensitive layer composed of a photosensitive material exemplified hereinabove formed on the support. A resin layer may further be provided on top of the photosensitive layer. A specific example is disclosed in U.S. Pat. No. 3,136,637, and comprises a support, and a photosensitive layer and an oleophilic, hydrophobic, water-soluble and solvent-softenable resin layer formed on the support in this order. When this photosensitive printing plate is exposed imagewise, the exposed areas of the photosensitive layer become insoluble in a developing solution and simultaneously are bonded to the resin layer on top thereof. The unexposed areas of the photosensitive layer, however, do not change at all, and are soluble in the developing solution. Thus, when the exposed photosensitive printing plate is processed with the developer solution, the unexposed areas of the photosensitive layer are dissolved in the developer solution which penetrates through the resin layer and when the surface of the exposed printing plate is lightly rubbed with, for example, a swab impregnated with the developer solution, the resin layer in the unexposed area is removed. However, the exposed areas of the photosensitive layer and the resin layer above these areas are not affected by the developer solution, and remain on the support. Thus, a printing plate having a firm image can be obtained.

The photosensitive printing plate described in British Pat. No. 1,478,333 and 1,478,334 is also within the photosensitive printing plates having a matting layer thereon which can be used in this invention.

A matting layer composed of a resin and a matting agent dispersed therein is formed on the surface of various photosensitive printing plates exemplified above. In the present invention, at least one resin selected from the group consisting of rosin and rosin esters is used as the resin binder for the matting agent.

The rosin esters are obtained by esterifying abietic acid which is a chief ingredient of rosin, and include, for example, methyl abietate, hydrogenated methyl abietate, diethylene glycol abietate, diethylene glycol 2-hydroabietate, a monoethylene glycol ester of rosin, and a pentaerythritol ester of rosin. Of these resins, the hydrogenated methyl abietate and the monoethylene glycol ester of rosin are especially preferred. While the rosin or rosin esters are generally the only binder material present in the matting layer in accordance with the present invention, those skilled in the art will realize that other resins sometimes may be added to the layer without taking away the advantages of the present invention.

Examples of the matting agent used in this invention include silicon dioxide, zinc oxide, titanium oxide, zirconium oxide, glass particles, alumina, starch, polymer particles (e.g., particles of polymethyl methacrylate, polystyrene, or phenolic resin), and the matting agents disclosed in U.S. Pat. Nos. 2,701,245 and 2,992,101. These matting agents can be used either singly or in combination with one another.

The diameter of the particles of the matting agent and the mixing ratio between the matting agent and the resin can be properly determined by those skilled in the art according to the desired surface roughness. In the present invention the surface roughness, Ha ($H_{CLA}$: center-line average roughness), is in the range of about 0.4 to 4 microns, preferably 0.8 to 1.3 microns. If the surface roughness is less than 0.4 micron, the effect of shortening the time required for close contact by the vacuum-contacting method is reduced. On the other hand, when it is larger than 4 microns, the contact of an image-bearing original with the photosensitive printing plate becomes incomplete, and the clearity of the image decreases. To maintain the surface roughness within the above range, the suitable diameter of the particles of the matting agent is within the range of about 2 to 40 microns, preferably 8 to 15 microns.

The amount of the matting agent is suitably about 0.01 to 4 parts by weight, preferably 0.05 to 2 parts by weight, per part by weight of the binder.

Generally, the formation of a resin layer containing the matting agent on the surface of the photosensitive printing plate is performed by dispersing the matting agent in a solution of the binder resin in a suitable solvent, and coating the dispersion on the surface of the photosensitive printing plate. The solvent should be a poor solvent for the matting agent but a good solvent for the resin in which the matting agent is to be dispersed, and should not substantially dissolve the surface of the photosensitive printing plate. Representative examples of solvents suitable for coating the matting layer are aromatic solvents such as toluene and xylene, acetates such as ethyl acetate, butyl acetate, isoamyl acetate and n-amyl acetate, and hydrocarbons such as heptane and octane. Such a solvent can be easily selected by those skilled in the art once the surface of the photosensitive printing plate, the matting agent and the resin have been selected.

The matting layer in the photosensitive printing plate of this invention may be in various forms.

Figure 1B:
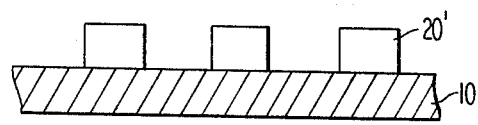

FIG. 1 (a) is a cross-sectional view of a photosensitive printing plate in accordance with one embodiment of the present invention. It has a photosensitive layer 20 and a resin layer 30 having a matting agent 31 dispersed therein successively on a support 10. FIG. 1 (b) shows the cross-section of the photosensitive printing plate shown in FIG. 1 (a) after exposure and development. An image 20' is formed on the support 10, and the resin layer containing the matting agent is absent as a result of having been removed by a developing solution.

Figure 2A:
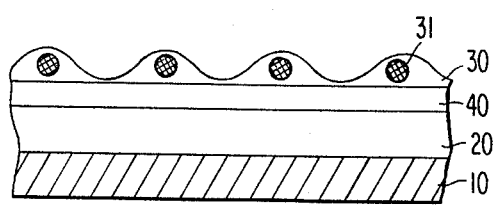
Figure 2B:
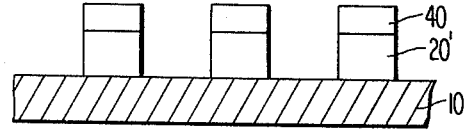

FIG. 2 (a) is a cross-sectional view of a photosensitive printing plate in accordance with another embodiment of this invention. On a support 10 are provided a photosensitive layer 20, a resin layer 40 permeable to a developing solution and incapable of being dissolved by the developing solution and a resin layer 30 containing a matting agent 31, in the order mentioned. FIG. 2 (b) shows the cross-section of the photosensitive printing plate shown in FIG. 2 (a) after exposure and development. Either one of the exposed area or unexposed area 20' of the photosensitive layer and the resin 40 at a portion above such an area remain as an image, and the resin layer containing the matting agent is absent as a result of having been removed by the developer solution.

Figure 3A:
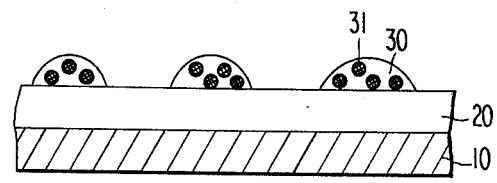
Figure 3B:
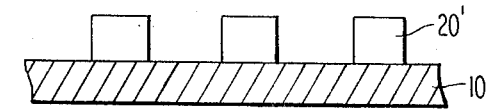

FIG. 3 (a) is a cross-sectional view of a photosensitive printing plate in accordance with still another embodiment of the invention. A photosensitive layer 20 and a matting layer are formed on a support 10. The matting layer is made of a fine pattern composed of a mixture of coated areas and uncoated areas. FIG. 3 (b) shows the cross-section of the photosensitive printing plate shown in FIG. 3 (a) after exposure and development. Either one of the exposed areas or unexposed areas 20' of the photosensitive layer remains on the support 10 as an image, and the matting layer is absent as a result of having been removed by the developer solution.

In the embodiments of the invention described hereinabove, the matting layer is removed upon development, for example, by adding an organic solvent such as benzyl alcohol to the developer solution. A photosensitive printing plate in which the matting layer located above image areas is not removed by the developer solution is also included within the scope of this invention.

An especially preferred method for providing the matting layers in the above embodiment (FIG. 3) is described in detail in British Pat. No. 1,542,131.

The coating amount of the matting layer to be coated cannot be defined definitely because it varies depending upon the form of the matting layer. For example, in the case of the matting layers shown in FIG. 1 (a) and FIG. 2 (a), the coating amount of the matting layer is about 0.05 to 1 $g/m^2$, preferably 0.1 to 0.5 $g/m^2$, after drying.

In the embodiment shown in FIG. 3 (a), the matting layer is coated in the following manner. The height of the coated areas is in the range of about 2 to about 40 microns, preferably 5 to 20 microns, and the size (width) is 20 to 10,000 microns, preferably 50 to 5,000 microns. The distance between adjacent coated areas is 50 to 100,000 microns, preferably 100 to 50,000 microns. The surface roughness of the matting layer, $H_{CLA}$ (the centerline surface roughness) is in the range of about 0.05 to about 20 microns, preferably from about 0.1 to about 10 microns.

In imagewise exposing the photosensitive printing plate of this invention, no special conditions owing to the matting of its surface is required.

The following Examples illustrate the present invention more specifically. All percentages are by weight.

EXAMPLE 1

An aluminum plate having a thickness of 0.24 mm was degreased by dipping it in a 7% aqueous solution of sodium tertiary phosphate at 60° C. The plate was washed with water, and then grained with a nylon brush while flowing a suspension of pumice in water over it. After washing, the aluminum plate was dipped for 30 to 60 seconds in a 5% aqueous solution of sodium silicate (JIS #3, $SiO_2/Na_2O$ mol ratio being from 3.1 to 3.3) kept at 70° C.

The aluminum plate was sufficiently washed with water and dried, and coated with a photosensitive composition having the following formulation. The 2-hydroxyethyl methacrylate copolymer (I) was prepared by the method described in Example 1 of U.S. Pat. No. 4,123,276.

2-Hydroxyethyl methacrylate copolymer (I)—0.87 g
2-Methoxy-4-hydroxy-5-benzoylbenzenesulfonic acid salt of a condensation product between p-diazodiphenylamine and para-formaldehyde—0.1 g
Oil Blue #603 (a product of Orient Chemical Industry Co., Ltd.)—0.03 g
2-Methoxyethanol—6 g
Methanol—6 g
Ethylene dichloride—6 g The weight of the photosensitive coating composition coated after drying was 1.0 $g/m^2$.

Two types of solutions having the following formulations were coated on the photosensitive layer so that the amount of these layers after drying was 0.3 $g/m^2$, and then dried. A photosensitive printing plate shown by the cross-sectional view of FIG. 1 (a) was obtained.

Formulation of Coating Solution ($C_1$) (Comparison)

Water—100 g
Hydroxypropyl methyl cellulose (the degree of hydroxypropoxylation 7 to 12 mol %; the degree of methoxylation 28 to 30 mol %)—2 g
Siloid (silica gel, a trademark for a product of Fuji Davison Co., Ltd.; average particle diameter 10 microns)—0.2 g Formulation of Coating Solution ($C_2$) (Invention)

Toluene—100 g
Hercolyn D (hydrogenated methyl abietate, a product of Hercules Powder Company)—1 g
Glass beads (average particle diameter 10 microns)—0.1 g The time required to contact the image-bearing original intimately with photosensitive printing plates coated with the coating solutions ($C_1$) and ($C_2$) were shortened to ½ to ⅓ from a photosensitive printing plate not containing a matting layer. Each of the printing plates was imagewise exposed for 40 seconds by a metal halide lamp placed 1 m away from the printing plates, and dipped for 1 minute at room temperature with a developer solution having the following formulation. The surface of each of the printing plates was then lightly rubbed with a degreased cotton swab to remove the unexposed areas and to obtain lithographic printing plates.

Formulation of the Developer Solution

Benzyl alcohol—3.0 g
Sodium isopropylnaphthalenesulfonate—1.0 g
Sodium silicate (40% aq. soln.)—1.0 g
Water—95 g Printing was performed using the resulting printing plates. With the printing plate obtained from the plate coated with the coating solution ($C_1$), a clear printed copy was not obtained until after producing 50 copies, whereas with the printing plate obtained from the plate coated with the coating solution ($C_2$), the tenth copy was a good printed copy.

EXAMPLE 2

In the same way as in Example 1, photographic photosensitive lithographic printing plates were prepared except that the following two coating solutions were used as a resin layer containing a matting agent.

Formulation of Coating Solution ($C_3$) (Comparison)

Ethyl acetate—100 g
Phenolic resin—2 g
Fine powder of polyethylene (average particle diameter 10 microns)—1 g Formulation of Coating Solution ($C_4$) (Invention)

Ethyl acetate—100 g

Staybelite (diethylene glycol 2-hydroabietate, a product of Hercules Powder Company)—2 g
Fine powder of polyethylene (average particle diameter 10 microns)—1 g The time required for closely contacting an image-bearing original with the plate coated with the coating solution ($C_3$) or ($C_4$) was shortened to $\frac{1}{2}$ to $\frac{1}{3}$ from that with a plate not having a matting layer formed thereon. Printing plates were made in the same way as in Example 1 using the photosensitive lithographic printing plates obtained. With the printing plate coated with the coating solution ($C_3$), the developing time required was 3 minutes, and the plate-making property was deteriorated as a result of providing a resin layer containing the matting agent. In contrast, with the printing plate coated with the coating solution ($C_4$), the developing time required was 1 minute. The provision of the matting layer did not cause an increase in the developing time, and no effect on the property of a printing plate was seen.

EXAMPLE 3

A grained aluminum plate having a thickness of 0.3 mm was anodized in sulfuric acid to form an oxide coating at a rate of about 2 g/m². It was washed well and dried and coated with a photosensitive composition having the following formulation, and dried to form a photosensitive plate having a photosensitive layer having the photosensitive composition at a rate of 2.5 g/m².

Formulation of the Photosensitive Composition

Naphthoquinone-1,2-diazide-5-sulfonic acid ester of polyhydroxyphenyl (described in Example 1 of U.S. Pat. No. 3,635,709)—1 g
Novolak-type phenol/formaldehyde resin—2 g
2-Methoxyethyl acetate—20 g
Methyl ethyl ketone—20 g Each of the coating solutions ($C_3$) and ($C_4$) used in Example 2 was coated on the resulting photosensitive layer and dried. The amount of the coating after drying was 0.2 g/m in each case. Thus, a photosensitive printing plate having the cross-section shown in FIG. 1 (a) was obtained. The time required for closely contacting an image-bearing original with each of the plates coated with ($C_3$) and ($C_4$) was shortened to $\frac{1}{2}$ to $\frac{1}{3}$ from that with a plate not having a matting layer formed thereon.

Each of the plates was imagewise exposed in the same way as in Example 1, and developed with a 7% aqueous solution of sodium silicate. The developing time was 3 minutes in the case of the plate coated with ($C_3$), whereas it was 1 minute in the case of the plate coated with ($C_4$). With the printing plate coated with the coating solution ($C_4$), no increase in developing time which might be ascribable to the formation of a matting layer was noted. No effect was seen to be exerted on the plate-making property and the printing performance.

EXAMPLE 4

Photosensitive lithographic printing plates were made in the same way as in Example 1 except that each of the following four coating solutions was used as a resin layer containing a matting agent.

Formulation of Coating Solution ($C_5$) (Invention)

Acetone—100 g
Rosin—2 g
Glass beads (10 microns)—0.05 g

Formulation of Coating Solution ($C_6$) (Invention)

Butyl acetate—100 g
Methyl abietate—1.5 g
Powdery polyethylene (average particle diameter 10 microns)—0.4 g Formulation of Coating Solution ($C_7$) (Invention)

n-Heptane—100 g
Monoethylene glycol ester of rosin—2.0 g
Powdery polyethylene (10 microns)—0.3 g Formulation of Coating Solution ($C_8$) (Invention)

Monochlorobenzene—100 g
Abietic acid—1.8 g
Polymethyl methacrylate (particle diameter 10 microns)—0.5 g The time required for closely contacting an image-bearing original with the plates coated with the coating solutions ($C_5$), ($C_6$), ($C_7$) and ($C_8$) was $\frac{1}{2}$ to $\frac{1}{3}$ from that with a plate not having a matting layer coated thereon.

Printing plates were made in the same way as in Example 1, and the printing performance of these plates was examined. No effect on the plate-making property and the printing performance, which might have been exerted owing to the provision of a resin layer containing a matting agent, was seen.

While the invention has been described in detail and with reference to specific embodiments thereof, it will be apparent to one skilled in the art that various changes and modifications can be made therein without departing from the spirit and scope thereof.

What is claimed is:

1. A photosensitive printing plate forming material comprising a support, a photosensitive layer, and, on the surface of said photosensitive layer a matting layer composed of a resin and a fine particulate material dispersed therein, said resin being at least one member selected from rosin and rosin esters.

2. The photosensitive printing plate forming material of claim 1, wherein said rosin ester is methyl abietate, hydrogenated methyl abietate, diethylene glycol abietate, diethylene glycol 2-hydroabietate, a monoethylene glycol ester of rosin, or a pentaerythritol ester of rosin.

3. The photosensitive printing plate forming material of claim 2, wherein said rosin ester is hydrogenated methyl abietate or a monoethylene glycol ester of rosin.

4. The photosensitive printing plate forming material of claim 1, wherein said printing plate forming material additionally includes a resin layer intermediate said photosensitive layer and said matting layer.

5. The photosensitive printing plate forming material of claim 1, wherein the surface of said support is rendered hydrophilic.

6. The photosensitive printing plate forming material of claim 1, wherein said support is paper, polyolefin coated paper, a metal sheet, or a paper or plastic film laminated or vacuum deposited with a metal.

7. The photosensitive printing plate forming material of claim 6, wherein said support is an aluminum plate.

8. The photosensitive printing plate forming material of claim 1, wherein said photosensitive layer is a combination of (a) a photosensitive compound and (b) a binder.

9. The photosensitive printing plate forming material of claim 8, wherein said photosensitive layer contains a diazo compound.

* * * * *